United States Patent
Chen et al.

[11] Patent Number: 6,150,264
[45] Date of Patent: Nov. 21, 2000

[54] METHOD OF MANUFACTURING SELF-ALIGNED SILICIDE

[75] Inventors: Shu-Jen Chen, Hsinchu; Ruoh-Haw Chang, Po-Tzu; Chih-Ching Hsu, Hsinchu, all of Taiwan

[73] Assignee: United Semiconductor Corp., Hsin-Chu, Taiwan

[21] Appl. No.: 09/075,420

[22] Filed: May 8, 1998

[30] Foreign Application Priority Data

Mar. 17, 1998 [TW] Taiwan ................................. 87103892

[51] Int. Cl.⁷ .................................................. H01L 21/44
[52] U.S. Cl. ........................ 438/655; 438/683; 438/664
[58] Field of Search ................................. 438/586, 655, 438/682, 630, 581, 583

[56] References Cited

U.S. PATENT DOCUMENTS

| | | | |
|---|---|---|---|
| 5,187,120 | 2/1993 | Wang | 438/628 |
| 5,612,253 | 3/1997 | Farahani et al. | 438/630 |
| 5,780,361 | 7/1998 | Inoue | 438/586 |
| 5,953,633 | 9/1999 | Chen et al. | 438/655 |

*Primary Examiner*—Mary Wilczewski
*Assistant Examiner*—Yung A. Lin
*Attorney, Agent, or Firm*—Christie, Parker & Hale, LLP

[57] ABSTRACT

The invention relates to a method for manufacturing of a titanium self-aligned silicide (Salicide). This process includes of forming a metal layer over the surfaces of the semiconductor substrate and the gate electrode. Then, a rapid thermal process is performed with three stages to form the salicide, for example, titanium silicide, at the interface between the titanium and silicon, namely on the surfaces of the gate electrode and source/drain region. The rapid thermal process with three stages includes using the first stage with the first temperature to form the early titanium silicide having the C49 phase. The temperature is raised to a second temperature and the RTA process is performed with nitrogen gases to transform the high resistance phase C49 of the titanium nitride into a low resistance phase C54 in the second stage. Then, the temperature is rapidly raised to a third temperature to transform the C49 phase into the C54 phase completely and to prevent the agglomeration phenomenon.

10 Claims, 4 Drawing Sheets

METHOD OF MANUFACTURING SELF-ALIGNED SILICIDE

CROSS-REFERENCE TO RELATED APPLICATION

This application claims the priority benefit of Taiwan application Ser. No. 87103892, filed Mar. 17, 1998, the full disclosure of which is incorporated herein by reference.

BACKGROUND OF THE INVENTION

Field of the Invention

The invention relates in general to a method for manufacturing of a semiconductor device, and more particularly to a method for manufacturing of a titanium self-aligned silicide (Salicide). A special thermal treatment is used in the invention in order to make the phase-transformation more complete and to prevent the agglomeration phenomenon.

As the level of integration for MOS devices increases, resistance in the source/drain terminals of the MOS device gradually rises to a value comparable to the channel resistance of the MOS device. To ensure integrity at the shallow junction between metallic contacts and the MOS terminals, and for the downward adjustment of sheet resistance in the source/drain terminals, self-aligned silicide processes are now employed in the manufacturing of ultra large scale integrated (ULSI) circuits with a line width less than 0.5 $\mu$m. Because of the low resistance of the titanium silicide, the ohmic contact formed at the interface between titanium silicide and silicon will be excellent.

FIGS. 1A to 1C are cross-sectional views showing a conventional process for making the self-aligned silicide.

First, as shown in FIG. 1A, a semiconductor substrate 10 is provided, and shallow trench isolation regions 12 and MOS transistors 10' are formed above the substrate 10.

The MOS transistors 10' consist of gate electrodes 18, spacers 16 formed around the periphery of the gate electrodes 18 and source/drain regions 14 formed near the surface of the substrate 10 and around the periphery of the gate electrodes 18. The spacers 16 can be made from a material such as dielectric compound.

Next, in FIG. 1B, a layer of titanium metal 28 is deposited, for example, using a magnetically controlled DC sputtering method, over the surface of the semiconductor substrate 10 to a thickness of about 200–1000 Å.

Next, in FIG. 1C, a layer of titanium silicide is formed at the interface between the titanium and silicon. Namely, a layer of titanium silicide 28a is formed on the surface of the source/drain regions 14 to reduce the sheet resistance of the source/drain regions 14.

Meanwhile, a titanium silicide layer 28b is formed by using a rapid thermal process (RTP) which has two stages.

The FIG. 2 is a plot of temperature vs. time during the silicide phase transform period in the conventional process Referring the FIG. 2, the early titanium silicide is formed by using a rapid thermal anneal (RTA) with nitrogen gases at a temperature of about 600–650° C. in the first stage 30. The early titanium silicide has the C49 phase. Then, the unreacted titanium metal and the titanium nitride formed by the reaction between the titanium metal and nitrogen gases are removed, for example, by using a RCA cleaning solution. The RCA cleaning solution consists of NH$_4$OH/HDIW (Hot De-ionization Water)/H$_2$O$_2$. The temperature is raised to about 800–900° C. and the RTA process is performed with nitrogen gases to transform the phase of the titanium silicide from C49 to C54 in the second stage 32. Then the surrounding temperature is decreased in the step 34.

The RTP process with two stages is used in the conventional process. It utilizes the longer time to transform the phase of the titanium silicide. Therefore, as the size of the device diminishes, the energy that the transformation needs is increases and a higher temperature is needed. However, the transformation of the phase is still incomplete. Therefore, the titanium silicide formed doesn't have a low resistance, and, the ohmic contact formed at the interface between the titanium silicide and the silicon will not be excellent. Moreover, the higher temperature and the longer time instigate the agglomeration phenomenon.

SUMMARY OF THE INVENTION

It is therefore an object of the invention to provide a salicide process. A special thermal treatment is used in the invention in order to make the phase-transformation more complete and to prevent the agglomeration phenomenon.

The invention achieves the above-identified objects by providing a new salicide process. This salicide process can be applied to a device of a semiconductor substrate; the device comprises a device isolation region, a gate electrode, a spacer formed at a sidewall of the gate electrode and a source/drain region formed near the surface of the substrate and around the periphery of the gate electrode.

This process has the following steps. A metal layer is formed, for example, a titanium layer, over the surfaces of the semiconductor substrate and the gate electrode. Then, a rapid thermal process with three stages is performed to form the salicide, for example, titanium silicide, at the interface between the titanium and silicon, namely on the surfaces of the gate electrode and source/drain region.

The rapid thermal process with three stages includes the following. The first stage forms the early titanium silicide having the C49 phase at the temperature of about 600–750° C. Then, the unreacted titanium metal and the titanium nitride formed by the reaction between the titanium metal and nitrogen gases are removed. The temperature is raised to about 800–900° C. and the RTA process is performed with nitrogen gases to transform the high resistance phase C49 of the titanium nitride into a low resistance phase C54 in the second stage. Then, the temperature is rapidly raised to about 950–1000° C. to transform the C49 phase into the C54 phase completely.

The characteristic of the invention is that of rapidly raising the temperature to about 950–1000° C. in the third stage to provide the driving force to transform the C49 phase into the C54 phase completely and to prevent the agglomeration phenomenon.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
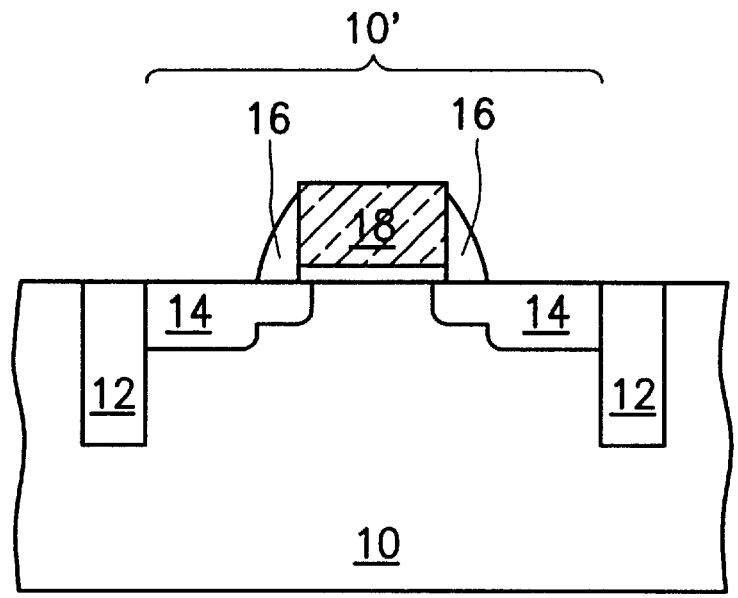
FIGS. 1A to 1C (prior art) are cross-sectional views showing a conventional process for manufacturing the self-aligned silicide.
Figure 1B:
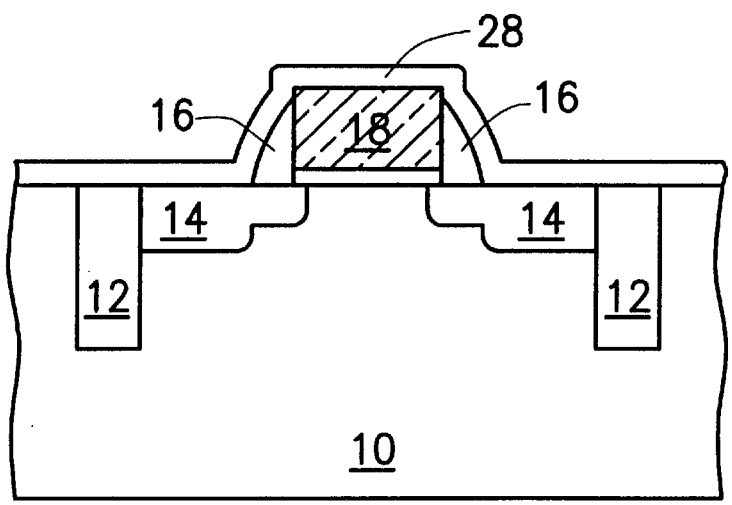
Figure 1C:
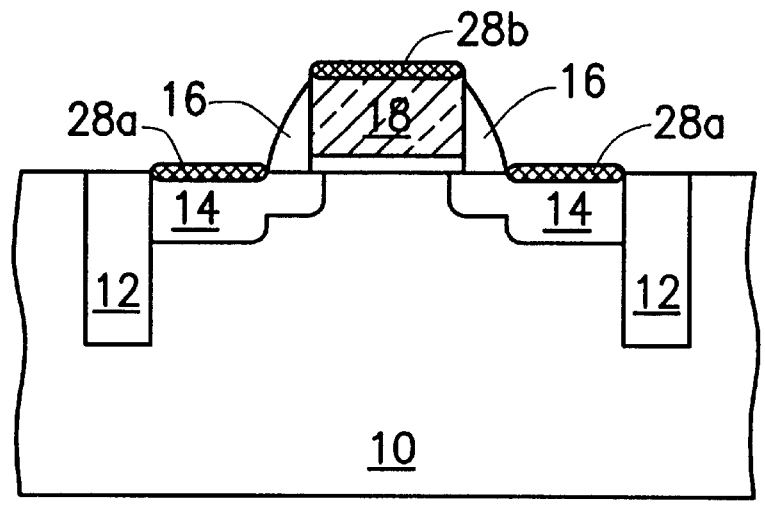
Figure 2:
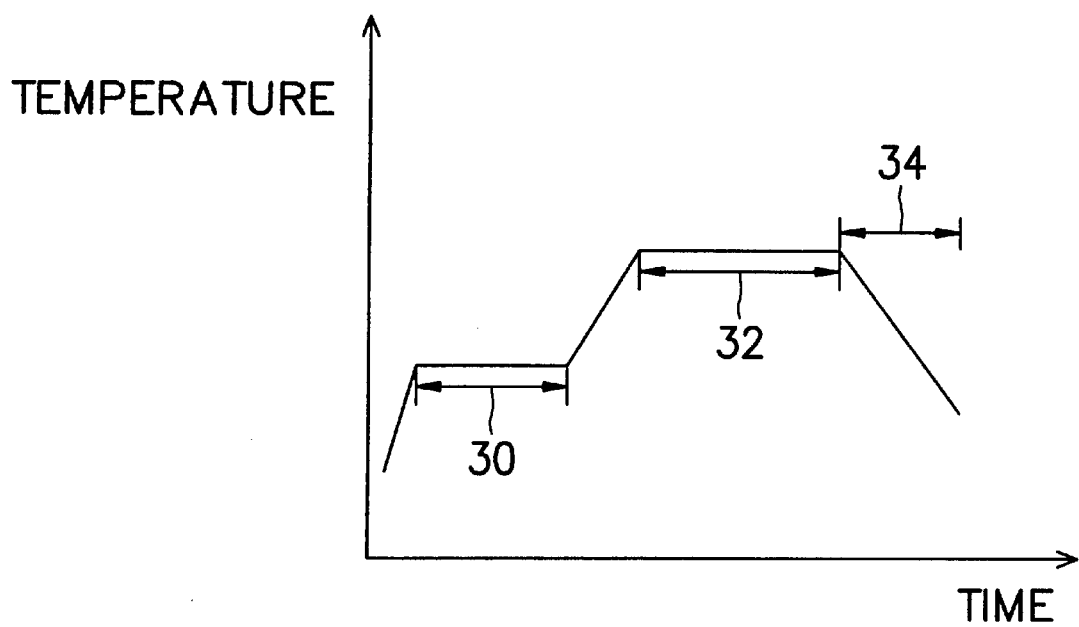
FIG. 2 is a plot of temperature vs. time during the silicide phase transform period in the conventional process.
Figure 3A:
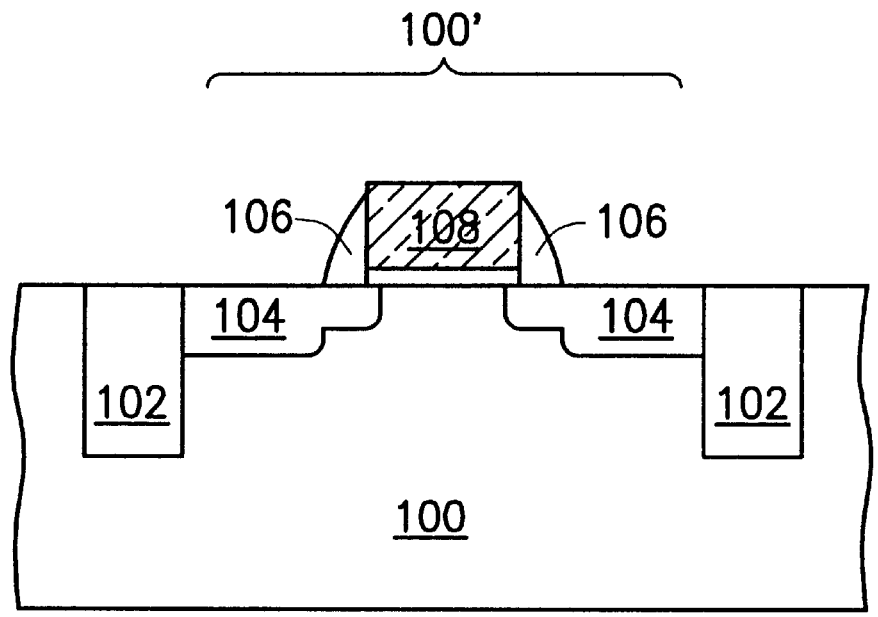
FIGS. 3A to 3C are cross-sectional views showing the process steps for manufacturing the self-aligned silicide according to the present invention.
Figure 3B:
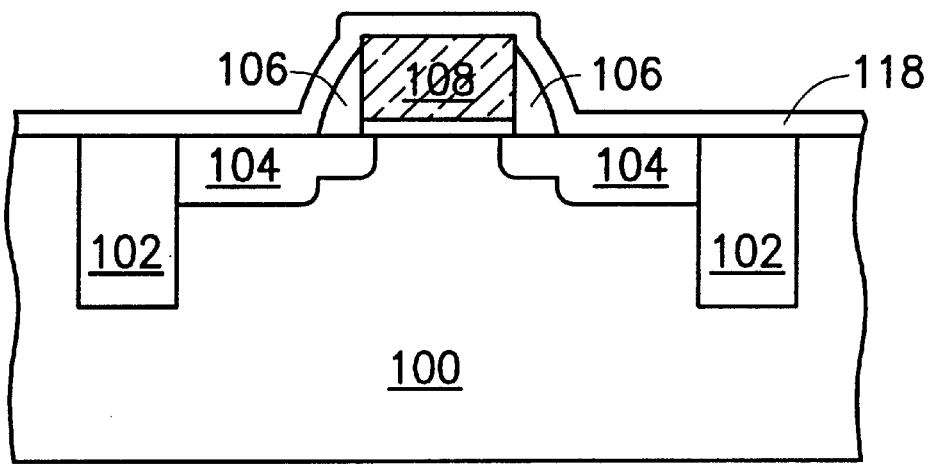
Figure 3C:
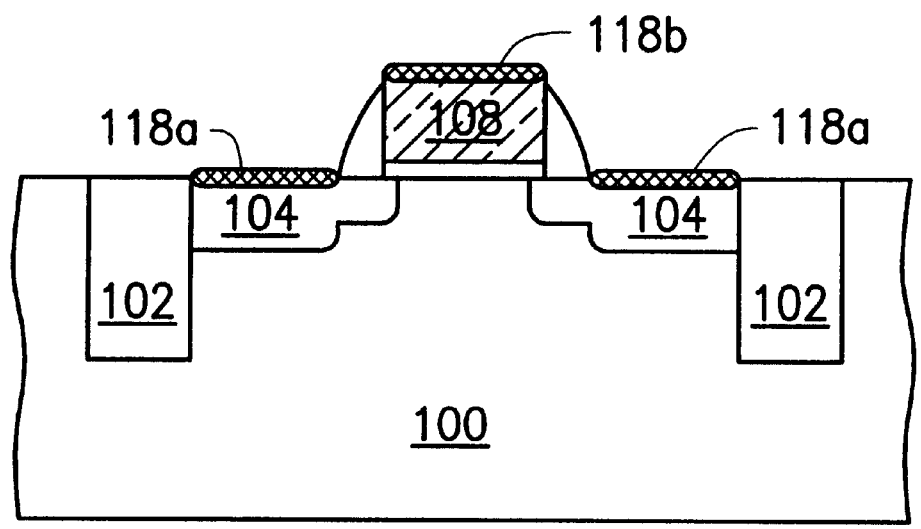

FIGS. 3A to 3C are cross-sectional views showing the process steps for manufacturing the self-aligned silicide according to the present invention.

Referring first to FIG. 3A, a semiconductor substrate 100 is provided. Shallow trench isolation regions 102 and MOS transistors 100' are formed above the substrate 100. The MOS transistors 100' includes the gate electrodes 108, spacers 106 formed around the periphery of the gate electrodes 108 and source/drain regions 104 formed near the surface of the substrate and around the periphery of the gate electrodes 108. The spacers 106 can be made from material such as dielectric compound.

Next, as shown in FIG. 3B, a magnetically controlled DC sputtering method is performed to form a layer of metal 118, for example, titanium metal, over the surfaces of the substrate 100 and gate electrodes 108 to a thickness of about 200–1000 Å. The metal 118 can be used to form the salicide.

Referring FIG. 3C, a rapid thermal process with three stages is used to form a titanium silicide layer 118*a* at the interface between the titanium and silicide, namely, on the surface of the source/drain regions 104 to reduce the sheet resistance of the source/drain regions 104. A titanium silicide layer 118*b* is formed on the surface of the gate electrode 108 to facilitate the electrical operation of the gate electrode 108.

Figure 4:
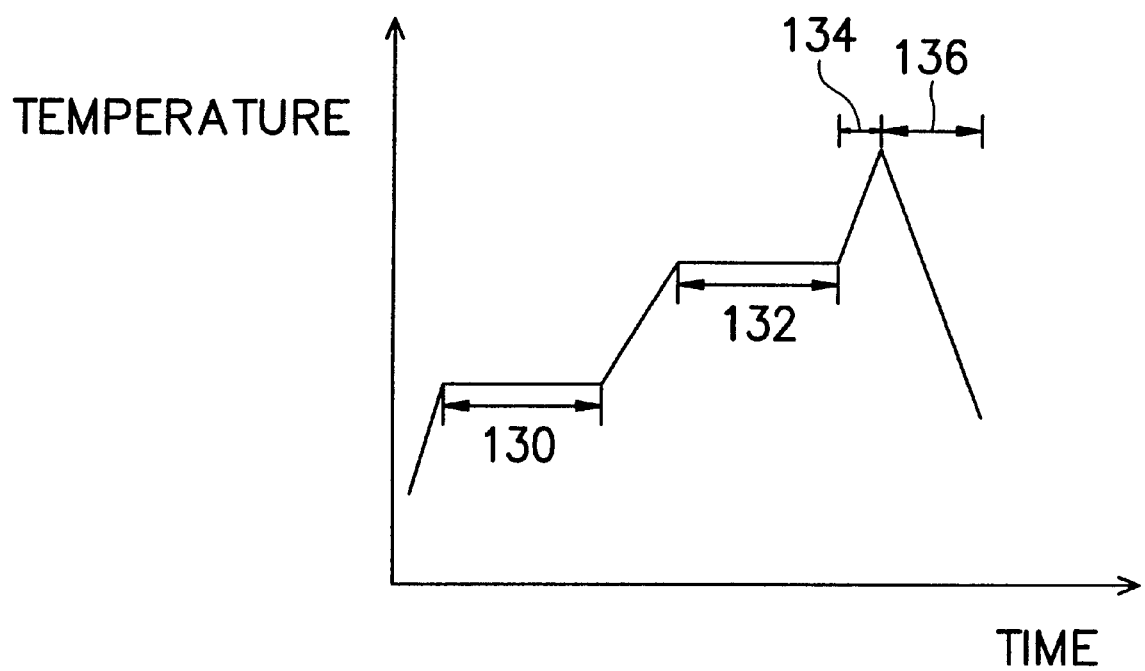
FIG. 4 is a plot of temperature vs. time during the silicide phase transform period according to the present invention.

FIG. 4 is a plot of temperature vs. time during the silicide phase transform period according to the present invention.

Referring to FIG. 4, the early formation of the titanium silicide is performed by using the rapid thermal process with the nitrogen gases and is carried out at a temperature of about 600–750° C. in the first stage 130. The early titanium silicide has a C49 phase. Next, the unreacted titanium metal and titanium nitride which is formed by the reaction between the titanium metal and nitrogen gases are removed, for example, by using a RCA cleaning solution, wherein the RCA cleaning solution comprises $NH_4OH/HDIW/H_2O_2$. Then, the second stage 132 of the rapid thermal process is carried out with nitrogen gases and the temperature of the rapid thermal process is raised to about 800–900° C., thereby transforming a high resistance phase C49 of the titanium nitride into a low resistance phase C54.

It is a key point of the invention that a third stage 134 of the rapid thermal process is performed after the second stage 132. The temperature of the rapid thermal process is raised to a temperature of about 950–1000° C. as quickly as possible in the third stage 134, thereby transforming the C4 phase of the titanium nitride into the C54 phase completely. Then the surrounding temperature is reduced in the step 136. The titanium silicide is formed by the interactive diffusion and chemical reaction between titanium and silicon. The titanium silicide is a low resistance compound; therefore the ohmic contact formed at the interface of titanium and silicon will be excellent.

The characteristic of the invention is that rapidly raising the temperature to about 950–1000° C. in the third stage provides the driving force to transform the C49 phase into C54 phase completely and to prevent the agglomeration phenomenon.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a self-aligned silicide, comprising the steps of:

providing a semiconductor substrate having a gate electrode and source/drain regions;

forming a metal layer over the surface of the semiconductor substrate, which includes covering the surface of the semiconductor substrate and source/drain regions;

performing a thermal process with a first temperature to transform the metal layer into an early suicide on the surface of the gate electrode and source/drain region;

removing the metal layer which is not transformed into the early suicide;

performing the thermal process with a second temperature; and changing the second temperature into a third temperature of about 950°–1000° C. thereby rapidly and completely transforming the early silicide into silicide.

2. A method according to claim 1, wherein the metal layer formation step comprises using magnetically controlled DC sputtering method.

3. A method according to claim 1, wherein the early metal removing step comprises using RCA cleaning solution.

4. A method according to claim 1, wherein the thermal treatment comprises a rapid thermal process.

5. A method according to claim 1, wherein the metal layer comprises titanium.

6. A method according to claim 1, wherein the first temperature is about 600–750° C.

7. A method according to claim 1, wherein the second temperature is about 800–900° C.

8. A method according to claim 5, wherein the silicide comprises titanium silicide.

9. A method according to claim 5, wherein the early silicide has the C49 phase.

10. A method according to claim 5, wherein the silicide has the C54 phase.

* * * * *